(12) United States Patent
Sugiyama et al.

(10) Patent No.: US 7,772,554 B2
(45) Date of Patent: Aug. 10, 2010

(54) CHARGED PARTICLE SYSTEM (75) Inventors: Akiyuki Sugiyama, Hitachinaka (JP);
Hidetoshi Morokuma, Hitachinaka (JP);
Yutaka Hojo, Hitachinaka (JP); Yukio Yoshizawa, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 299 days.

(21) Appl. No.: 12/098,127

(22) Filed: Apr. 4, 2008

(65) Prior Publication Data
US 2008/0245965 A1 Oct. 9, 2008

(30) Foreign Application Priority Data
Apr. 5, 2007 (JP) ............................. 2007-099363

(51) Int. Cl.
*G01N 23/00* (2006.01)
(52) U.S. Cl. ...................................................... 250/310
(58) Field of Classification Search .................. 250/310
See application file for complete search history.

(56) References Cited

U.S. PATENT DOCUMENTS

| 6,868,175 | B1 | 3/2005 | Yamamoto et al. |
| 7,348,559 | B2 * | 3/2008 | Agemura et al. ............ 250/310 |
| 7,615,746 | B2 * | 11/2009 | Nagatomo et al. ........... 250/307 |
| 2002/0015518 | A1 | 2/2002 | Matsuoka |
| 2006/0193508 | A1 | 8/2006 | Sutani et al. |
| 2007/0092129 | A1 | 4/2007 | Sugiyama et al. |
| 2007/0223803 | A1 | 9/2007 | Shindo et al. |
| 2008/0037830 | A1 | 2/2008 | Sugiyama et al. |

FOREIGN PATENT DOCUMENTS

| JP | 2001-338304 A | 12/2001 |
| JP | 2002-031525 A | 1/2002 |

* cited by examiner

*Primary Examiner*—Kiet T Nguyen
(74) *Attorney, Agent, or Firm*—Crowell & Moring LLP (57) ABSTRACT To provide a charged particle system capable of facilitating comparison between an actual pattern and an ideal pattern using not only two-dimensional CAD data but also three-dimensional CAD data. According to the present invention, using information about the angle of irradiation of a sample with a charged particle beam, a two-dimensional display of an ideal pattern (design data, such as CAD data, for example) is converted into a three-dimensional display, and the three-dimensional ideal pattern is displayed with an observation image. If the three-dimensional ideal pattern is superimposed on the observation image, comparison thereof can be easily carried out. Examples of the ideal pattern include a circuit pattern (CAD data) based on semiconductor design information, an exposure mask pattern based on an exposure mask used for exposure of a semiconductor wafer, and an exposure simulation pattern based on exposure simulation based on the exposure mask and an exposure condition can be used, and at least one of these patterns is displayed three-dimensionally.

11 Claims, 9 Drawing Sheets

CHARGED PARTICLE SYSTEM

BACKGROUND OF THE INVENTION

1. Field of the Invention

The present invention relates to a charged particle system. In particular, it relates to a system suitable for checking for a difference between a pattern and a CAD pattern (an ideal pattern), for example.

2. Background Art

In inspection and analysis of a pattern on a semiconductor integrated circuit, the difference between the pattern on the semiconductor integrated circuit and computer aided design (CAD) data is examined. Design data, such as CAD data, specifies an ideal shape and a position of a semiconductor device, and therefore, position matching and shape matching can be conducted by using the CAD data. It is common practice to carry out position matching using the design data in inspection of a semiconductor integrated circuit. Furthermore, it is common practice to carry out matching based on image processing between a pattern formed on a semiconductor wafer that has a shape different from that of an ideal pattern specified by the design data due to the effect of the manufacturing process and the ideal pattern specified by the design data.

For example, the patent literatures 1 and 2 disclose detecting edges of an inspection-target pattern and a reference pattern using a critical dimension scanning electron microscope (abbreviated as CD-SEM, hereinafter) as an apparatus for inspecting a semiconductor integrated circuit using design data and comparing the detected edges to determine the amount of deformation of a pattern with respect to the design data. The CD-SEM is an apparatus that measures dimensions of a pattern formed on a sample based on a secondary electron produced when the sample is scanned with an electron beam. It is common practice to carry out position matching by comparing the pattern image formed by the CD-SEM or the like with CAD data.

Other semiconductor inspecting apparatus include a type that imaging a semiconductor wafer by perpendicularly irradiating the semiconductor wafer with a charged particle or light, such as an electron beam, from above and detects a defect from the acquired image and a type that uses the defect or failure detected by such a type of apparatus for more precise analysis.

Furthermore, there is a defect inspecting SEM or the like as an apparatus that images a semiconductor wafer from above and analyzes a defect or failure thereof.

For analysis of a defect or failure of a semiconductor device, a high-resolution SEM or a transmission electron microscope (TEM) is used. A sample piece introduced to such analysis apparatus is prepared using a focused ion beam (FIB) apparatus. The FIB apparatus has a powerful beam focusing capability and carries out fine processing using a sputtering phenomenon.

In general, the CD-SEM and the defect inspecting SEM perpendicularly image the wafer from above. In this case, design data is used. The design data for the semiconductor circuit stored in GDSII or other formats describes the circuit pattern viewed from above. Therefore, although the shape varies due to a problem with the semiconductor manufacturing process as described above, it is possible to relatively easily implement the semiconductor manufacturing process even with the methods of the patent literatures 1 and 2 by using the design data.

Patent literature 1: JP Patent Publication (Kokai) No. 2001-338304A (corresponding to U.S. Pat. No. 6,868,175)

Patent literature 2: JP Patent Publication (Kokai) No. 2002-31525A (corresponding to US2002/0015518)

SUMMARY OF THE INVENTION

However, it is difficult to apply the method using the design data described above directly to the operation of the high-resolution SEM, the TEM and the FIB used for precise analysis. This is because the high-resolution SEM, the TEM, and the FIB require imaging of an analysis sample, such as a wafer and a sample piece. For example, the FIB used for preparing a sample piece requires ion beam irradiation of the sample from which the sample piece is to be cut out from a plurality of directions. The high-resolution SEM is often used for analysis of the cross section of a wafer. Therefore, it is difficult to apply the conventional methods that are designed to image a wafer from above, that is, the methods disclosed in the patent literatures 1 and 2, directly to the operation of the high-resolution SEM because the direction of imaging and the direction of the design data in the conventional methods are different from those in the high-resolution SEM.

The present invention has been made in view of such circumstances, and an object of the present invention is to provide a charged particle system capable of facilitating comparison between an actual pattern and an ideal pattern using not only two-dimensional CAD data but also three-dimensional CAD data.

In order to attain the object described above, according to the present invention, using information about the angle of irradiation of a sample with a charged particle beam, a two-dimensional display of an ideal pattern (design data, such as CAD data, for example) is converted into a three-dimensional display, and the three-dimensional ideal pattern is displayed with an observation image. If the three-dimensional ideal pattern is superimposed on the observation image, comparison thereof can be easily carried out. Examples of the ideal pattern include a circuit pattern (CAD data) based on semiconductor design information, an exposure mask pattern based on an exposure mask used for exposure of a semiconductor wafer, and an exposure simulation pattern based on exposure simulation based on the exposure mask and an exposure condition can be used, and at least one of these patterns is displayed three-dimensionally.

More specifically, a charged particle system according to the present invention comprises: charged particle beam controlling means that controls a charged particle beam to scan a predetermined region of a sample with the charged particle beam; charged particle applying means capable of irradiating the sample with the charged particle beam in an inclined direction; observation image generating means that detects an electron emitted from a part of the sample irradiated with the charged particle beam when the sample is irradiated with the charged particle beam and generates an observation image of the region of the sample scanned with the charged particle beam based on the amount of electrons detected; and image processing means that displays the observation image and an ideal pattern image on a display section. The image processing means calculates an angle of display of the ideal pattern based on an inclination angle of the charged particle beam with respect to the sample, inclination-converts the shape of the ideal pattern, and displays the inclination-converted ideal pattern as a three-dimensional pattern on the display section.

Other features of the present invention will be apparent from the detailed descriptions of the preferred embodiments and the accompanying drawings.

A charged particle system according to the present invention can facilitate comparison between an actual pattern and an ideal pattern by using three-dimensional CAD data.

DETAILED DESCRIPTION OF THE PREFERRED EMBODIMENTS

The present invention relates to a simple method for position matching after change of the imaging direction, a precise inspection and analysis method and an inspection and analysis system for an inspection and analysis apparatus that is capable of changing the direction of imaging a structure on a semiconductor wafer, a semiconductor exposure mask or a liquid crystal or a piece of a semiconductor, a piece of a semiconductor exposure mask or a piece of a liquid crystal.

In the following, with reference to the drawings, best modes for implementing a charged particle system according to the present invention will be described in detail. The embodiments of the present invention described below are only specific examples of the present invention, the present invention is not limited to the specific embodiments, and various variations and improvements of the configuration and the function described in each embodiment are possible without departing from the spirit of the present invention.

Figure 1:
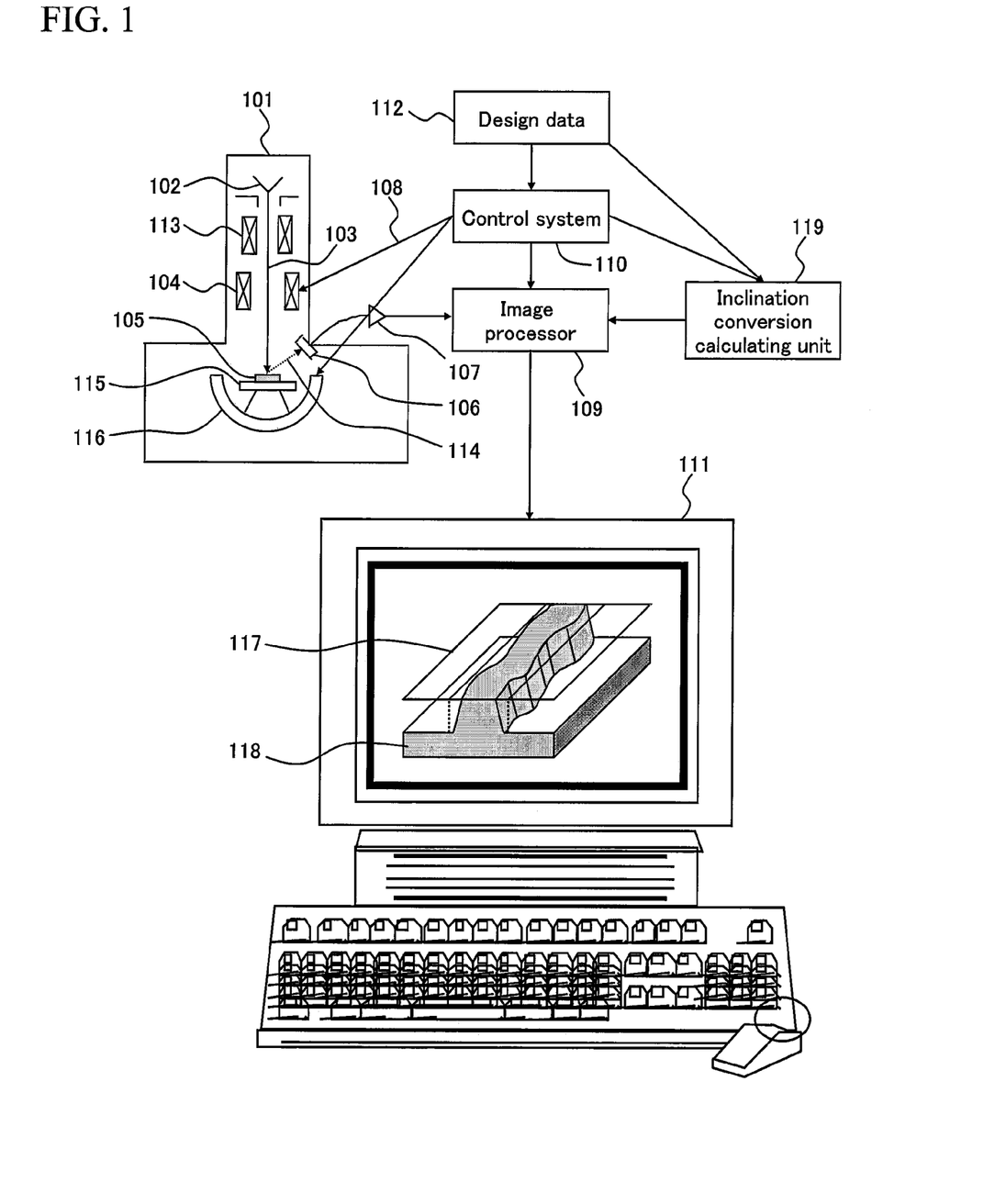
FIG. 1 is a schematic diagram showing a configuration of a scanning electron microscope according to an embodiment of the present invention.

Specific Examples of Charged Particle System (1) FIG. 1 is a schematic diagram showing a configuration of a scanning electron microscope system according to an embodiment of the present invention.

An electron beam 103 emitted from an electron gun 102 in an electron microscope 101 is focused by an electron lens 113, and a sample 105 is irradiated with the focused electron beam. The electron irradiation causes emission of a secondary electron 114 from the surface of the sample 105. An electron detector 106 detects the intensity of the secondary electron 114 or a reflected electron, and an amplifier 107 amplifies the intensity. A deflector 104 for moving the position of irradiation of the electron beam 103 allows the surface of the sample 105 to be raster-scanned with the electron beam 103 under the control of a control signal 108 from a control system 110. A signal output from the amplifier 107 is AD-converted by an image processor 109 to produce digital image data. A display device 111 is a device for displaying image data. A region to be inspected can be arbitrarily designated in design data 112 of a semiconductor chip, such as CAD data. A sample table 115 can incline the sample 105 with respect to the electron beam 103 under the control of a sample table controller 116. The display device 111 can display a picked-up image 118 of the sample 105 taken in an inclined direction and an inclination-converted circuit pattern 117, which is calculated from the information of the design data 112 by an inclination conversion calculating unit 119 based on angle information from the sample stage controller 116. The control system 110 carries out control for imaging or inspection of a semiconductor wafer based on the design data 112 and information about the region to be inspected and communication with the image processor 109. A system constituted by the electron microscope 101, the image processor 109, the control system 110, the display device 111, the inclination conversion calculating unit 119 and a device for storing the design data 112 has communication means for data exchange (not shown in FIG. 1).

Whereas CAD data is used as the design data (an ideal pattern) in this example, at least one of an exposure mask pattern based on an exposure mask used for exposure on a semiconductor wafer and an exposure simulation pattern based on an exposure simulation based on an exposure mask and an exposure condition can also be used. The same holds true for the following description.

Figure 2:
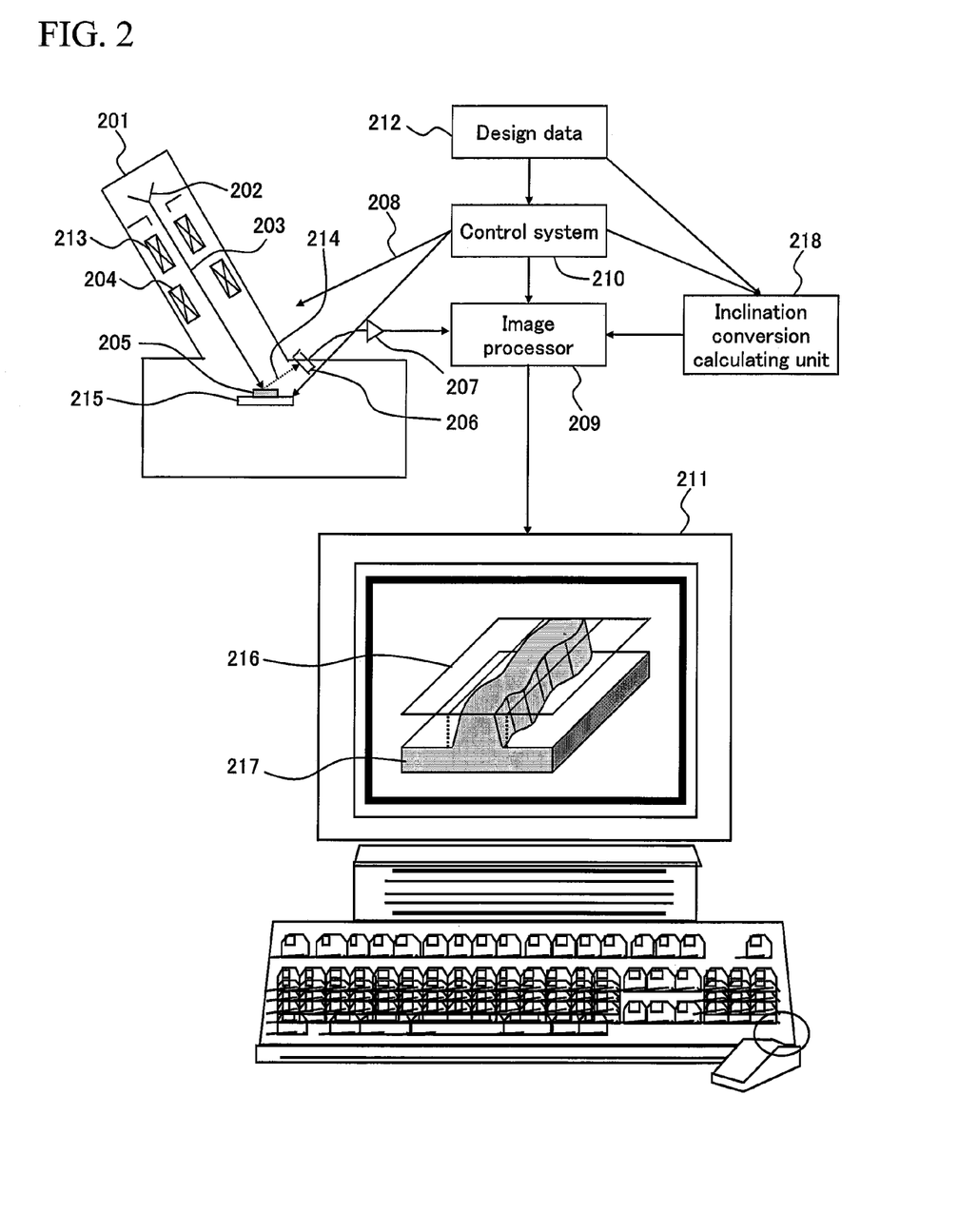
FIG. 2 is a schematic diagram showing a configuration of a scanning electron microscope according to another embodiment of the present invention.

(2) FIG. 2 is a schematic diagram showing a configuration of a scanning electron microscope system according to another embodiment of the present invention, which is different from the configuration shown in FIG. 1.

An electron beam 203 emitted from an electron gun 202 in an electron microscope 201 is focused by an electron lens 213, and a sample 205 is irradiated with the focused electron beam. The electron irradiation causes emission of a secondary electron 214 from the surface of the sample 205, an electron detector 206 detects the intensity of the secondary electron 214, and an amplifier 207 amplifies the intensity. A deflector 204 for moving the position of irradiation of the electron beam 203 allows the surface of the sample 205 to be raster-scanned with the electron beam 203 under the control of a control signal 208 from a control system 210. A signal output from the amplifier 207 is AD-converted by an image processor 209 to produce digital image data. A display device 211 is a device for displaying image data. A region to be inspected can be arbitrarily designated in design data 212 of a semiconductor chip, such as CAD data. A sample table 215 is inclined with respect to the inclined electron beam 203, and therefore, the sample 205 can be imaged in an inclined direction. In addition, the sample table 215 can be arbitrarily rotated about a rotation axis vertical to the sample surface. The imaging direction can be changed by rotating the sample table 215.

The display device 211 can display a picked-up image 217 of the sample 205 taken in an inclined direction and an inclination-converted circuit pattern 216, which is calculated from the information of the design data 212 by angle conversion based on the angle of the electron beam 203 by an inclination conversion calculating unit 219. The control system 210 carries out control for imaging or inspection of a semiconductor wafer based on the design data 212 and information about the region to be inspected and communication with the image processor 209. A system constituted by the electron microscope 201, the image processor 209, the control system 210, the display device 211, the inclination conversion calculating unit 219 and a device for storing the design data 212 has communication means for data exchange (not shown in FIG. 2). In the configuration shown in FIG. 2, unlike the configuration shown in FIG. 1, the angle of electron beam irradiation is fixed.

Figure 3:
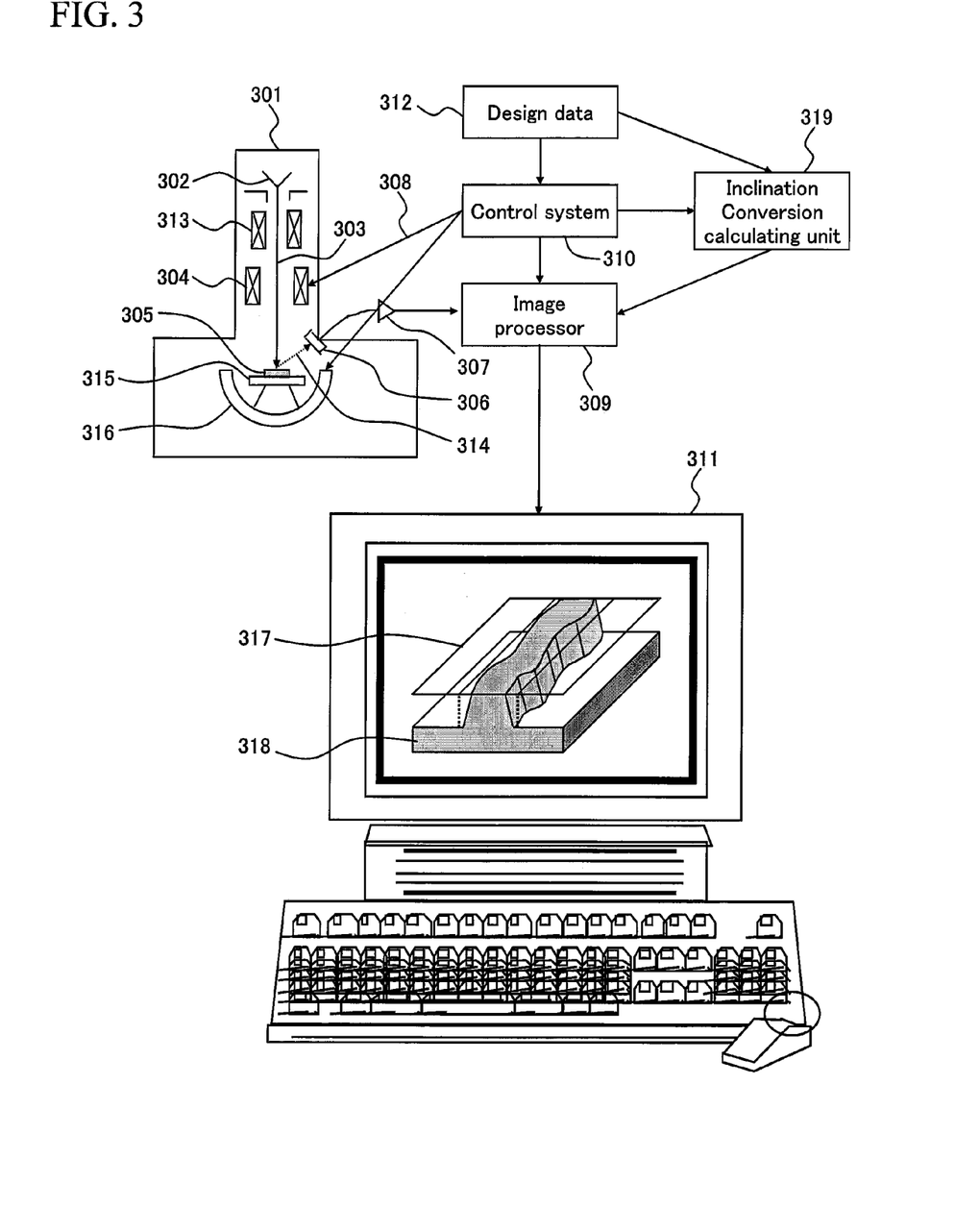
FIG. 3 is a schematic diagram showing a configuration of an FIB system according to an embodiment of the present invention.

(3) FIG. 3 is a schematic diagram showing a configuration of an FIB system according to an embodiment of the present invention.

An ion beam 303 emitted from an ion gun 302 in an FIB 301 is focused by an ion lens 313, and a sample 305 is irradiated with the focused ion beam. The ion beam irradiation causes emission of a secondary electron 314 from the surface of the sample 305, an electron detector 306 detects the intensity of the secondary electron 314, and an amplifier 307 amplifies the intensity. A deflector 304 for moving the position of irradiation of the ion beam 303 allows the surface of the sample 305 to be raster-scanned with the ion beam 303 under the control of a control signal 308 from a control system 310. A signal output from the amplifier 307 is AD-converted by an image processor 309 to produce digital image data.

A display device 311 is a device for displaying image data. A region to be inspected can be arbitrarily designated in design data 312 of a semiconductor chip, such as CAD data. A sample table 315 can incline the sample 305 with respect to the ion beam 303 under the control of a sample table controller 316. The display device 311 can display a picked-up image 318 of the sample 305 taken in an inclined direction and an inclination-converted circuit pattern 317, which is calculated from the information of the design data 312 by angle conversion based on the angle information from the sample table controller 316 by an inclination conversion calculating unit 319. In addition, the deflector 304 allows local ion beam irradiation, and the sample 305 is inclined or rotated under the control of the sample table controller 316. Therefore, the ion beam 303 can be applied at any angle, and a sample piece can be cut from the sample 305 by shaving. The control system 310 carries out control for imaging of a semiconductor wafer or processing of a sample based on the design data 312 and information about the region to be inspected and communication with the image processor 309. A system constituted by the FIB 301, the image processor 309, the control system 310, the display device 311, the inclination conversion calculating unit 319 and a device for storing the design data 312 has communication means for data exchange (not shown in FIG. 3).

Figure 4:
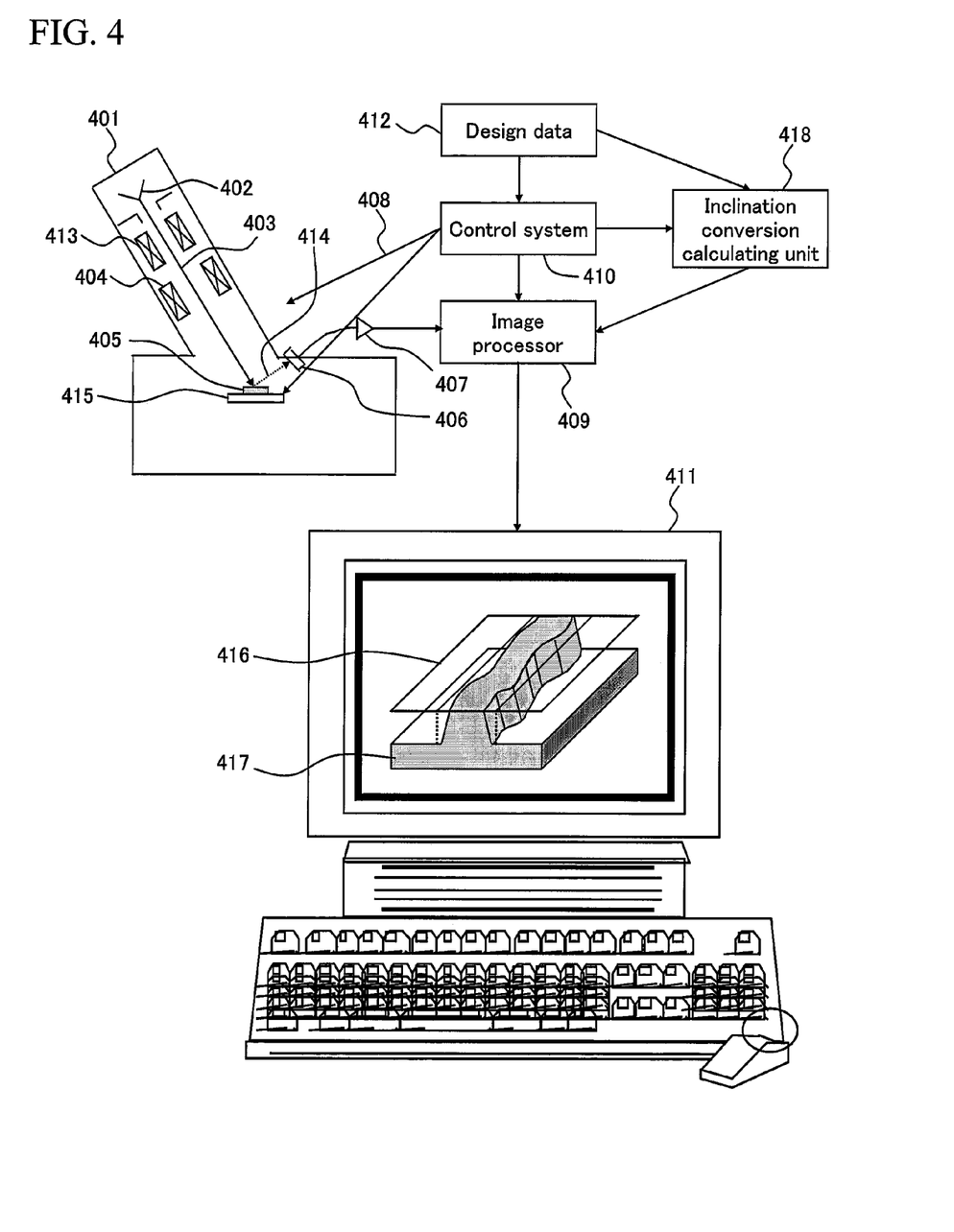
FIG. 4 is a schematic diagram showing a configuration of an FIB system according to another embodiment of the present invention.

(4) FIG. 4 is a schematic diagram showing a configuration of an FIB system according to another embodiment of the present invention, which is different from the configuration shown in FIG. 3.

An ion beam 403 emitted from an ion gun 402 in an FIB 401 is focused by an ion lens 413, and a sample 405 is irradiated with the focused ion beam. The ion beam irradiation causes emission of a secondary electron 414 from the surface of the sample 405, an electron detector 406 detects the intensity of the secondary electron 414, and an amplifier 407 amplifies the intensity. A deflector 404 for moving the position of irradiation of the ion beam 403 allows the surface of the sample 405 to be raster-scanned with the ion beam 403 under the control of a control signal 408 from a control system 410. A signal output from the amplifier 407 is AD-converted by an image processor 409 to produce digital image data.

A display device 411 is a device for displaying image data. A region to be inspected can be arbitrarily designated in design data 412 of a semiconductor chip, such as CAD data. A sample table 415 is inclined with respect to the inclined ion beam 403, and therefore, the sample 405 can be imaged in an inclined direction. In addition, the sample table 415 can be arbitrarily rotated about a rotation axis vertical to the sample surface. The imaging direction can be changed by rotating the sample table 415.

In addition, the deflector 404 allows local ion beam irradiation. By rotating the sample 405 by rotating the sample table 415, a sample piece can be cut from the sample 405 by shaving. A picked-up image 417 of the sample 405 taken in an inclined direction and an inclination-converted circuit pattern 416, which is calculated from the information of the design data 412 by angle conversion based on the angle of the ion beam 403 by an inclination conversion calculating unit 418, can be displayed on the display device 411.

The control system 410 carries out control for imaging or inspection of a semiconductor wafer based on the design data 412 and information about the region to be inspected and communication with the image processor 409. A system constituted by the FIB 401, the image processor 409, the control system 410, the display device 411, the inclination conversion calculating unit 418 and a device for storing the design data 412 has communication means for data exchange (not shown in FIG. 4).

Figure 5:
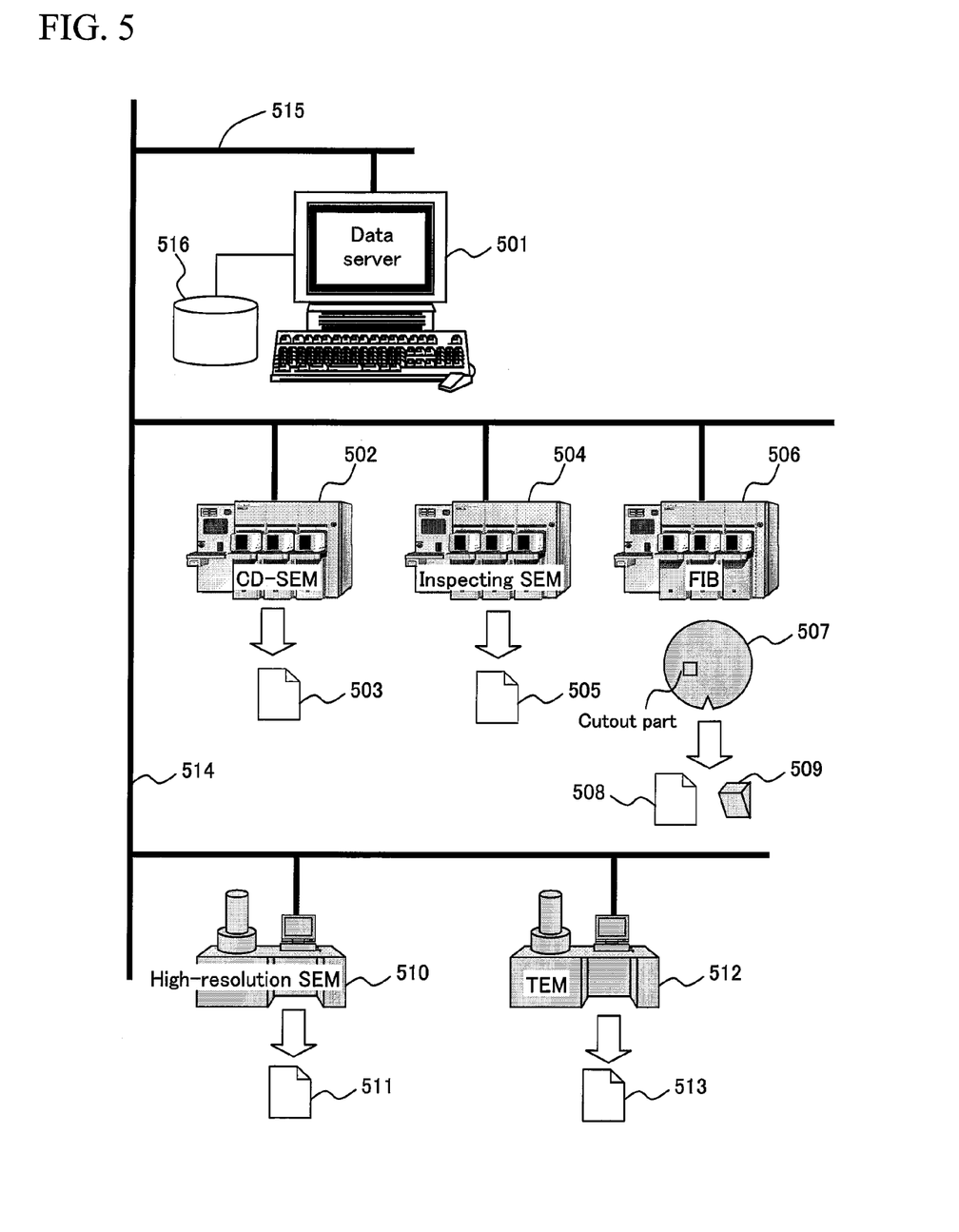
FIG. 5 is a diagram showing a network of various kinds of charged particle application devices and a data server.

(5) FIG. 5 is a diagram showing an example of a network of a data server 501, a CD-SEM 502, a defect inspecting SEM 504, an FIB 506, a high-resolution SEM 510, a TEM 512 and an operation thereof.

The data server 501 incorporates a CAD database 516, which stores design data, such as a circuit patterns of samples to be inspected or analyzed by various kinds of apparatus, exposure mask data, and exposure simulation data. The data server 501 is connected to the network via a LAN 514, and the data in the data server 501 can be referred to by various kinds of apparatus connected to the network. The CD-SEM 502 and the defect inspecting SEM 504 are intended to inspect a semiconductor wafer 507, image the wafer surface by perpendicularly applying an electron beam from above and carry out inspection based on the picked-up image. The inspection is carried out using the design data. The inspection by the CD-SEM 502 and the defect inspecting SEM 504 using the design data is automated. To achieve the automation, pattern matching is carried out between the design data and the picked-up image processed, and shape comparison is carried out between the design data and a structure in the picked-up image. Information about the position of inspection based on the design data is added to the inspection result, and the inspection result of the CD-SEM 502 is output as a CD-SEM result file 503, and the inspection result of the defect inspecting SEM 504 is output as a defect inspecting SEM result file 505.

The FIB 506 processes the part to be inspected of the semiconductor wafer 507 designated by the CD-SEM result file 503 output from the CD-SEM 502 or the defect inspecting SEM result file 505 output from the defect inspecting SEM 504 to produce a sample piece 509. The FIB 506 carries out ion beam irradiation by changing the angle of the ion beam. According to the present invention, positional information associated with the design data can be output as an FIB result file 508. The sample piece produced by the FIB is analyzed by the high-resolution SEM 510, the TEM 512 or the like. According to the present invention, the high-resolution SEM 510 can output the positional information associated with the design data as a high-resolution SEM result file 511, and the TEM 512 can output the positional information associated with the design data as a TEM result file 513. The positional information in the CD-SEM result file 503, the defect inspecting SEM result file 505, the FIB result file 508, the high-resolution SEM result file 511 and the TEM result file 513 can be managed in the same coordinate system as the design data, and therefore, the coordinates can be easily associated between different apparatus. For example, since the position of the cutout part of the wafer 507 is known, the part can be displayed by being superimposed on the corresponding CAD data. The data server 501 manages these results.

Specific Examples of Data Processing

In the following, specific examples of data processings carried out by image processors 109 to 409 will be described.

Figure 6:
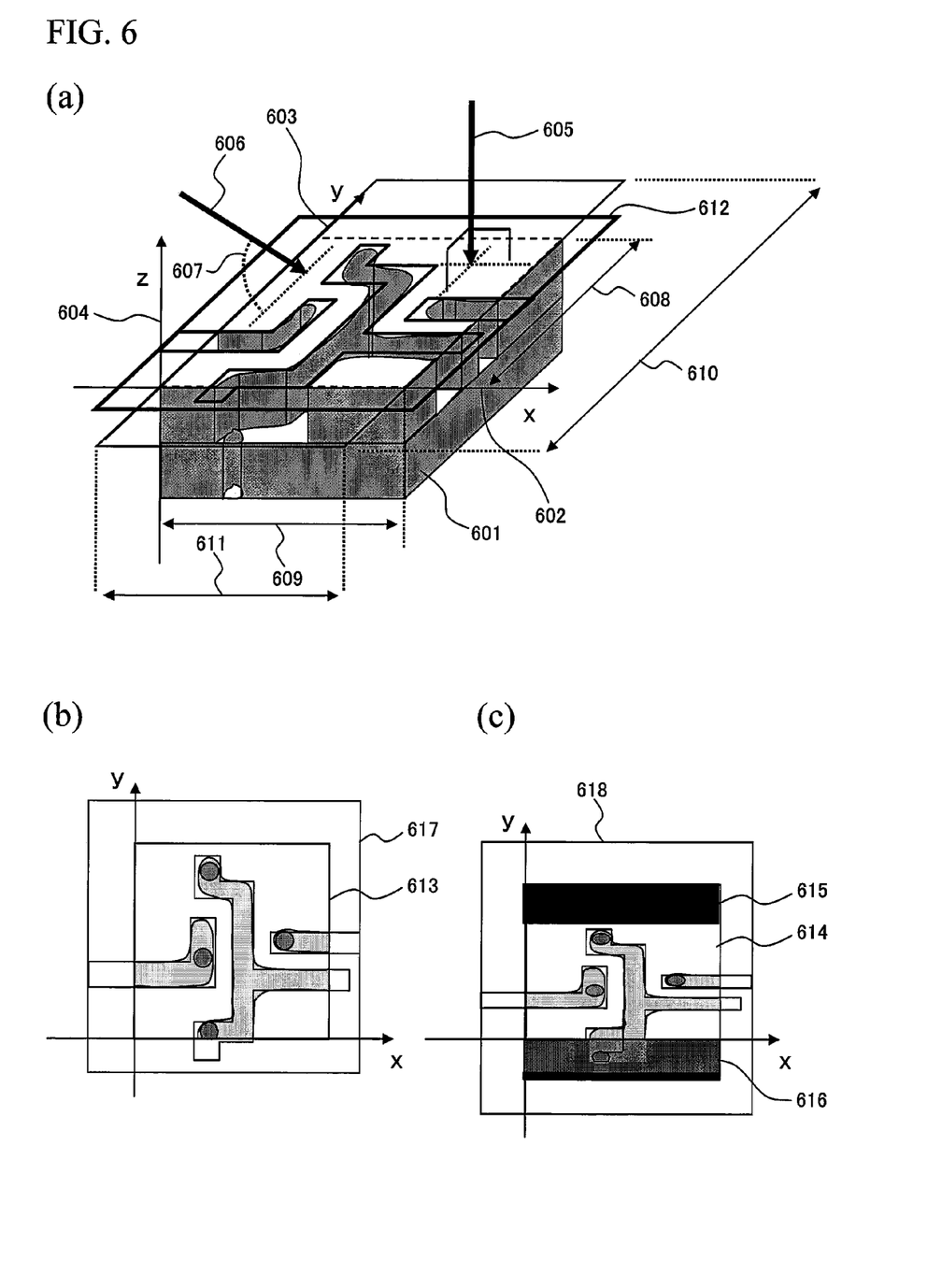
FIG. 6 includes diagrams showing directions of electron beam irradiation of a sample, a picked-up image and an inclination-converted circuit pattern.

(1) FIG. 6 includes diagrams showing the direction of an electron beam applied to a sample by a system according to an embodiment of the present invention, a picked-up image, and an inclination-converted circuit pattern. FIG. 6(a) shows three-dimensional CAD data converted from two-dimensional CAD data displayed superimposed on a (three-dimensional) image of a pattern on a sample. FIG. 6(b) shows a conventional plan-view display of CAD data superimposed on a pattern image. FIG. 6(c) shows a display of superimposed two-dimensional images viewed at an angle 607. The black part shown in FIG. 6(c) represents a part from which the beam is not reflected.

On a sample piece 601, an x-axis 602 and a y-axis 603, which perpendicularly intersect with each other on the sample surface, are set. In addition, a z-axis 604, which is perpendicular to the sample surface, is set. The sample piece 601 is raster-scanned with a perpendicular electron beam 605, which is perpendicular to the sample surface, within a range 609 in the x-axis direction and a range 608 in the y-axis direction, and imaging is carried out to acquire a perpendicular image 613. The raster scanning is carried out by controlling the deflector 104 in the scanning electron microscope system shown in FIG. 1.

Imaging with the perpendicular electron beam 605 perpendicular to the sample surface is efficiently carried out using the design data, as described in the patent literatures 1 and 2. In the case of using the design data, for example, matching based on image processing or shape comparison with a circuit pattern 617 is carried out. The circuit pattern 617 is formed in a format called GDSII, for example, is represented by data about coordinates of a rectangle or a line segment, and has a data structure constituted by a single layer or a plurality of layers. As an alternative to the circuit pattern 617, an exposure mask pattern or an exposure simulation pattern can also be used. It is also common practice to carry out imaging using an inclined electron beam 606 to acquire an image. Therefore, in this embodiment also, such conventional image acquisition is possible.

In the scanning electron microscope system shown in FIG. 1, in addition to being able to carry out the conventional image acquisition, the inclination angle 607 can be arbitrarily changed by changing the angle of the sample surface by controlling the sample table controller 116. The inclined electron beam 606 is perpendicular to the a-axis and inclined 45 degrees with respect to the x-y plane. If imaging of the sample piece is carried out by raster-scanning the sample piece with the inclined electron beam 606 under by controlling the deflector 104 in the same manner as in the raster scanning with the perpendicular electron beam 605, an inclined image 614 is acquired. The range of the raster scanning with the inclined electron beam 606 is represented by a range 611 in the x-axis direction and a range 610 in the y-axis direction. In the case of the inclined angle 607 shown in FIG. 6, the range 611 in the x-axis direction equals to the range 609 in the x-axis direction, and the range 610 in the y-axis direction equals to the range 608 in the y-axis direction divided by sin(inclined angle 607).

Therefore, the range of irradiation is widened in the y-direction. Supposing that the image generated by the image processor 109 contains the same number of pixels, the inclined image 614 is acquired. An upper part 615 of the inclined image 614 is a region in which the secondary electron intensity cannot be detected because the inclined electron beam 606 is not applied to the sample 601, and no secondary electron 614 is emitted. A sample cross section 616 is a region of a side surface of the sample 601 that can be imaged because the sample 601 is inclined. In the case where the inclined image 614 is taken and is used with the design data, if the circuit pattern 617 and the inclined image 614 are associated with each other, and matching based on image processing therebetween and shape evaluation thereof are carried out according to the conventional technique, it is difficult to carry out the matching based on image processing and the shape evaluation because the circuit pattern 617, which represents the top of the circuit, and the inclined image 614 representing the sample surface are different in ratio in the x-direction and the y-direction. However, according to the present invention, since the circuit pattern 617 is converted, and an inclination-converted circuit pattern 618 is used, matching based on image processing and shape evaluation of the inclined image can be carried out using the design data. The inclination-converted circuit pattern 618 can be created by converting the coordinates of the rectangles or line segments by the inclination angle 607. The coordinates of the inclination-converted circuit pattern shown in FIG. 6 can be calculated as follows:

the x-coordinate of the inclination-converted circuit pattern equals to the x-coordinate of the circuit pattern; and the y-coordinate of the inclination-converted circuit pattern equals to the y-coordinate of the circuit pattern divided by sin(inclination angle 607).

The coordinates of the circuit pattern can be converted in response to an inclination rotation by the inclination angle 607 by the calculation described above.

However, in the case of acquiring an inclined image, it is difficult to accurately determine the center axis of the inclination or rotation of the sample. In this case, translation in the x direction and the y direction has to be carried out for alignment.

Therefore, the x-coordinate and the y-coordinate of the inclination-converted circuit pattern are represented as follows:

the x'-coordinate of the inclination-converted circuit pattern equals to the x-coordinate of the circuit pattern plus the amount of shift in the x direction; and the y'-coordinate of the inclination-converted circuit pattern equals to the y-coordinate of the circuit pattern divided by sin(inclination angle 607) plus the amount of shift in the y direction.

The amount of shift in the x direction and the amount of shift in the y direction can be determined by calculation based on matching based on image processing or manual adjustment while viewing the display 111. In practical, the direction and the angle of the inclined electron beam 606 can be arbitrarily set, and the inclined image 614 can be acquired in any direction and at any inclination angle 607.

The inclination-converted circuit pattern 618 corresponding to the inclined image 614 can be created by a numerical operation taking into account the inclination angle 607 as described above. In addition to the inclination conversion of the circuit pattern, inclination conversion of an exposure mask pattern or an exposure simulation pattern can be carried out by the same calculation as described above, because the exposure mask pattern and the exposure simulation pattern are also represented by the coordinates of rectangles and line segments. The inclination-converted circuit pattern 618 is displayed superimposed on the inclined image 614 on the display device 111, and therefore, operators can recognize the sample that is the target of imaging.

Figure 7:
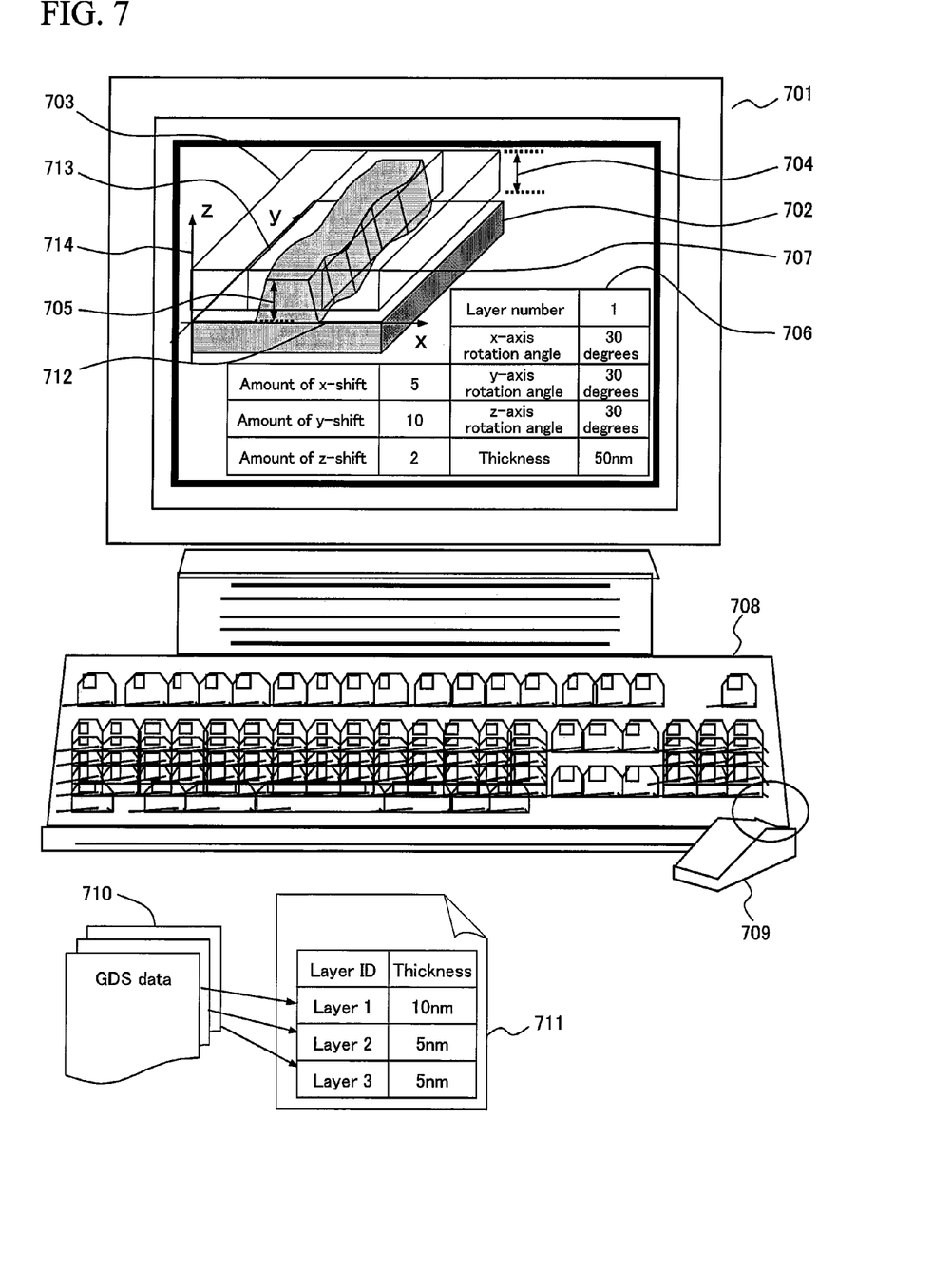
FIG. 7 is a diagram for illustrating a method of inputting, displaying and storing information about the thickness of each layer in an inclination-converted circuit pattern.

(2) FIG. 7 is a diagram for illustrating a method of determining and storing the order of input and display of information about the thickness of a layer of an inclination-converted circuit pattern in a system according to an embodiment of the present invention.

In FIG. 7, an inclined image 702 and an inclination-converted circuit pattern 703 are displayed on a display device 701. In general, the design data for a semiconductor circuit is (two-dimensional) data that does not include thickness information. When the inclination-converted circuit pattern 703 is displayed, an x-axis 712, a y-axis 713 and a z-axis 714 are set with respect to a surface of the inclination-converted circuit pattern. The x-axis and the y-axis are perpendicular to each other, and the x-y plane is parallel to the inclination-converted circuit pattern. The z-axis is perpendicular to the x-y plane and therefore is perpendicular to the inclination-converted circuit pattern. For points on rectangles and line segments on the inclination-converted circuit pattern 703, corresponding points having the same x- and y-coordinates and a different z-coordinate (thickness 704) are calculated. Then, if lines connecting the points on the inclination-converted circuit pattern 703 and the respective corresponding points are drawn, the inclination-converted circuit pattern 703 having a thickness can be displayed. Thus, the circuit pattern can be displayed with high reality and legibility, and operators can accurately recognize the pattern.

As for the information about the thickness 704, any thickness of any layer can be input via a GUI 706. The layer thickness information input via the GUI is reflected in the thickness 704 of the displayed inclination-converted circuit pattern 703. As an alternative to the numerical input via the GUI 706, the displayed inclination-converted circuit pattern 703 can also be modified by pointing the thickness 704 displayed on the display device 701 with a mouse 709 and changing the size of the arrow displayed. Not only a single inclination-converted circuit pattern but also a plurality of layers of inclination-converted circuit patterns can be displayed. The thickness information can be easily input for each of the plurality of layers. In addition, the input thickness information can be stored in a file 711.

Typically, the GDSII format contains information about a single or a plurality of layers and an ID for each layer. In this case, the thickness information file is stored with the layer ID information and the thickness information input by the method shown in FIG. 7 associated with each other. The thickness information file can be transmitted to or received from the data server 501 and other apparatus via the LAN 514.

Figure 8:
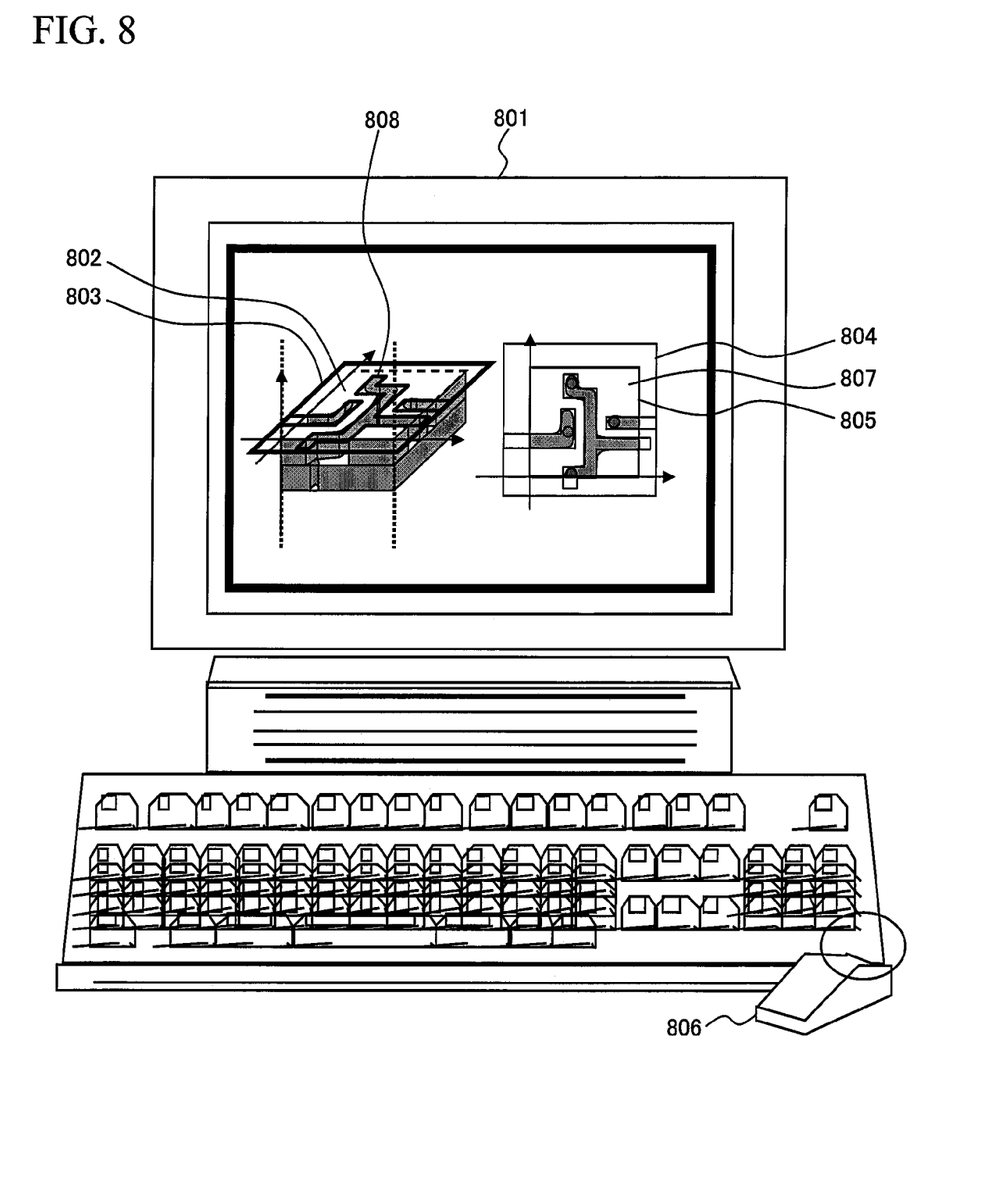
FIG. 8 is a diagram showing simultaneous display of a picked-up image, an inclination-converted circuit pattern, and a circuit pattern that is not inclination-converted.

(3) FIG. 8 is a diagram showing a simultaneous display of an inclined image, an inclination-converted circuit pattern and a circuit pattern that is not inclination-converted in a system according to an embodiment of the present invention.

In FIG. 8, an inclined image 802 and an inclination-converted circuit pattern 803 are displayed on a display device 801 according to the method shown in FIG. 6. As described above, the positional relationship between the image taken in the inclined direction and the image according to the design data is easy to recognize. However, for some operators, an image displayed without inclination is easier to recognize. In this case, a circuit pattern 804 that is not inclination-converted simultaneously displayed on the display device 801 helps such operators to recognize.

It can be configured that, when a point 807 on the circuit pattern 804 that is not inclination-converted is pointed with the mouse 806, a corresponding point 808 on the inclination-converted circuit pattern 803 changes in color or glows, or is marked with a marker, for example. Thus, a corresponding point announcing function for announcing the corresponding point 808 can be provided to further help the operator to recognize the data correspondence relationship. The corresponding point announcing function can be provided for any point, because the function involves only simple calculation of the coordinates of the point 808 on the inclination-converted circuit pattern 803 corresponding to the point 807 on the circuit pattern 804 that is not inclination-converted. In addition, the corresponding point announcing function can not only announce the corresponding point 808 on the inclination-converted circuit pattern 803 when the point 807 on the circuit pattern 804 that is not inclination-converted is pointed but also announce the point 807 on the circuit pattern 804 that is not inclination-converted when the point 808 on the inclination-converted circuit pattern 803 is pointed. Furthermore, if the inclination angle is known, an inclination-reverse-converted image 805 can be created by carrying out a pixel-by-pixel reverse conversion of the inclined image 802 of the sample surface based on the inclination angle. For some operators, the inclination-reverse-converted image is easier to recognize than the inclined image. However, when the sample surface is uneven, part of the sample surface cannot be imaged. Therefore, when the sample surface is significantly uneven, the inclination-reverse-converted image makes it harder to recognize the circuit pattern on the contrary.

Figure 9:
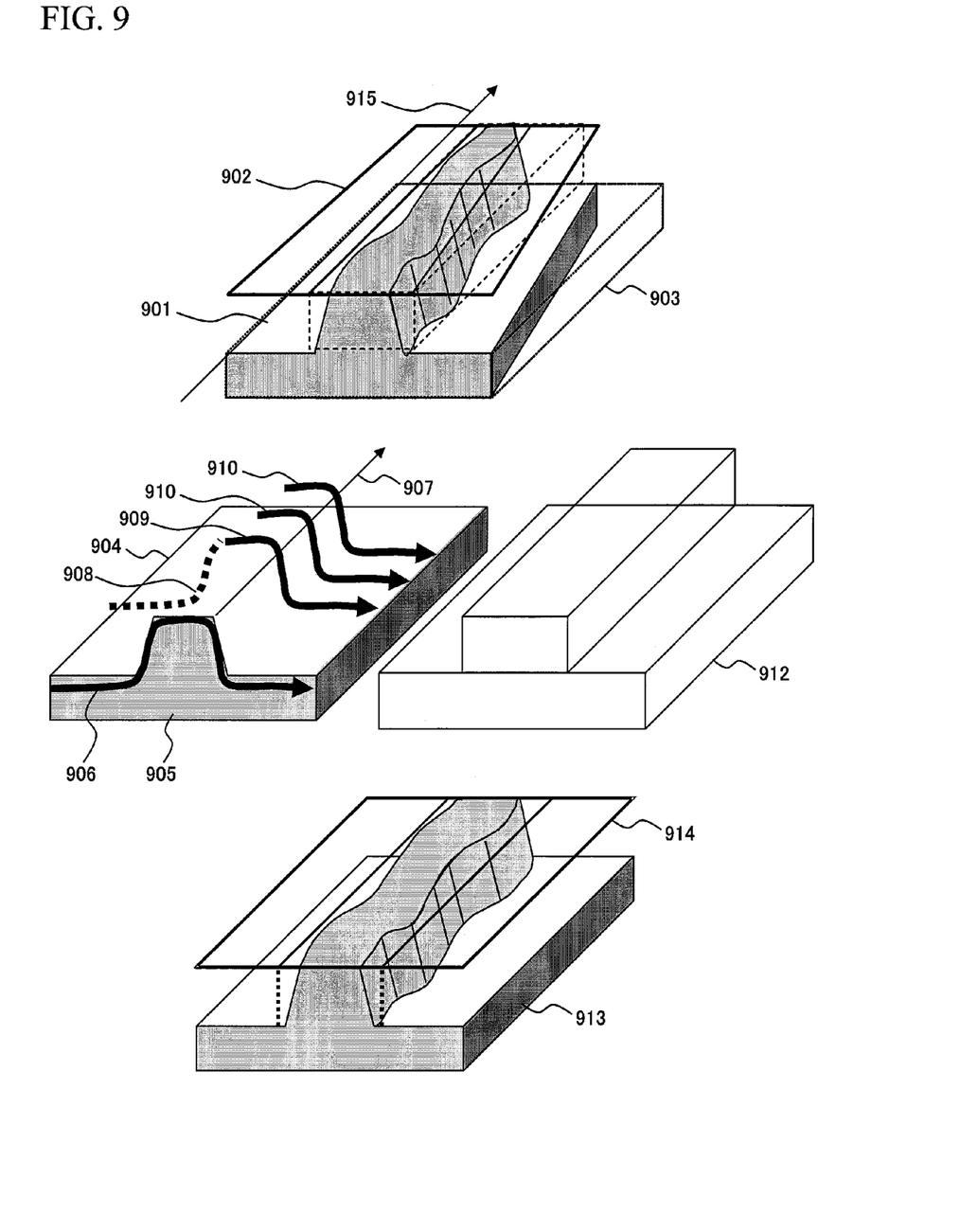
FIG. 9 includes diagrams for illustrating a method of taking an image without perspective by modifying the control of an electron beam based on positional information about a structure in design data when taking an inclined image.

(4) FIG. 9 is a diagram for illustrating a method of changing the electron beam control based on the positional information about a structure in design data and taking an image without perspective when taking an inclined image in a system according to an embodiment of the present invention.

It is common practice to image a linear structure on a semiconductor circuit with a high-resolution SEM or the like and carry out analysis or measurement of the image. In such a case, in general, as shown in an inclined image 901, the imaged structure becomes smaller as the distance from the electron gun 102 increases in a direction 915. This is the well-known effect of perspective. In general, the scanning electron microscope takes an image with the range of movement of the deflector 104 fixed without regard to the distance from the electron gun 102, and therefore, the area of the sample actually irradiated with electrons increases as the distance from the electron gun 102 increases. As a result, a part of the structure farther from the electron gun 102 is smaller in the image than a part of the structure closer to the electron gun 102. If the effect of perspective is eliminated so that the inclined image 901 of the structure is displayed as shown by a reference numeral 903, the error of the three-dimensional measurement of the structure can be reduced over a wider range. For the inclined image 901 of the structure, an inclination-converted circuit pattern 912 with thickness information (an ideal image) is created by displaying an inclination-converted circuit pattern according to the method shown in FIG. 6 and providing the inclination-converted circuit pattern with thickness information according to the method shown in FIG. 7. Then, a cross section 905, which is a plane closer to the electron gun 102, is imaged. Then, a main contour electron scanning trajectory 906 is provided along the contour of the cross section 905. The main contour electron scanning trajectory 906 can be provided by drawing the trajectory on the display device with a pointer device, such as a mouse, or extracting the contour from the image of the cross section by image processing. Typical methods of extracting the contour by image processing include a method using a differential filter and a snake method. Then, a sub depth scanning direction 907 is calculated from the inclination-converted circuit pattern with thickness information. The sub depth scanning direction 907 is the same as the direction 915.

Then, the main contour electron scanning trajectory 906 is translated in the sub depth scanning direction 907. In this step, the deflection angle of the deflector 104 is changed according to the distance from the electron gun 102 so that the range of electron irradiation is fixed even if the distance to the imaging target changes (so that the effect of perspective is eliminated). The ideal distance from the electron gun 102 can be calculated from the direction 915, and the focus of the electron beam is changed according to the distance. If the distance is known as forecast information, the focus can be appropriately adjusted to imaging targets at different distances using the electron lens 113.

However, since the sample has a three-dimensional structure, if the main contour electron scanning trajectory 906 is translated, a part 908 is hidden. Therefore, the hidden part is previously calculated by translating the main contour electron scanning trajectory 906 with respect to the ideal structure 912. This calculation is easy because the inclination-converted circuit pattern 912 with thickness information has the shape of a simple rectangular parallelepiped. A main contour electron scanning trajectory 909 is calculated from the main contour electron scanning trajectory 906, and imaging is carried out by translating the main contour electron scanning trajectory 909 in the sub depth scanning direction 907. By the electron control described above, an image 913 without perspective can be taken. Since the image 913 without perspective is an image having no distortion (effect of perspective) in the direction 915, if the image 913 without perspective is used for three-dimensional measurement of a structure, the error can be reduced over a wider range than in the case of using the inclined image taken according to the conventional method. In addition, the image 913 without perspective can be more precisely compared in shape with the circuit pattern 914.

SUMMARY

According to the embodiments of the present invention described above, when the direction of irradiation of charged particles, such as electrons and ions, is not perpendicular to the sample surface, the inclination-converted circuit pattern, the inclination-converted exposure mask pattern or the inclination-converted exposure simulation pattern (which are three-dimensional patterns) is displayed simultaneously with the picked-up image. Thus, the operator can easily recognize the imaged part of the semiconductor circuit. In addition, by comparing the shapes of the exposure mask pattern or exposure simulation pattern (the ideal pattern) and the observation image, the operator can easily recognize the difference between the ideal pattern and the observation image. In the embodiments described above, the term "sample surface" refers to a surface of a wafer that is parallel to the circuit pattern formed based on the design data. For three-dimensional structural analysis of the sample, the thickness and the vertical layer structure are taken into account, and therefore, the difference between the ideal pattern and the observation image can more easily recognized. In addition, since information about the thickness and height of each layer is stored, another part having the same layer structure can also be more easily inspected or analyzed.

In addition, when the picked-up image is displayed, an ideal pattern (a circuit pattern, an exposure mask pattern or an exposure simulation pattern) is displayed superimposed on the observation image. Therefore, the shape of the observation image can be more easily checked.

In addition, according to the embodiments described above, position matching in the automatic operation of the system can be carried out by carrying out pattern matching between the created inclination-converted circuit pattern, inclination-converted exposure mask pattern or inclination-converted exposure simulation pattern (an ideal three-dimensional pattern) and the observation pattern.

In addition, even when the automatic position matching based on the pattern patching cannot be achieved, position matching can be achieved and therefore the irradiation angle and position can be precisely adjusted by carrying out manual position matching between the ideal three-dimensional pattern and the observation image.

What is claimed is:

1. A charged particle system, comprising:
   charged particle beam controlling means that controls a charged particle beam to scan a predetermined region of a sample with the charged particle beam;
   charged particle applying means capable of irradiating said sample with said charged particle beam in an inclined direction;
   observation image generating means that detects an electron emitted from a part of said sample irradiated with said charged particle beam when said sample is irradiated with the charged particle beam and generates an observation image of the region of said sample scanned with said charged particle beam based on the amount of electrons detected; and
   image processing means that displays said observation image and an ideal pattern image on a display section,
   said image processing means calculates an angle of display of said ideal pattern based on an inclination angle of said charged particle beam with respect to said sample, inclination-converts the shape of the ideal pattern, and displays the inclination-converted ideal pattern as a three-dimensional pattern on said display section.

2. The charged particle system according to claim 1, wherein said ideal pattern includes at least one of a circuit pattern based on semiconductor design information, an exposure mask pattern based on an exposure mask used in exposure of a semiconductor wafer, and an exposure simulation pattern based on exposure simulation based on the exposure mask and an exposure condition.

3. The charged particle system according to claim 1, wherein said image processing means displays said ideal pattern superimposed on said observation image on said display section.

4. The charged particle system according to claim 1, wherein said image processing means displays said observation image and said ideal pattern as a two-dimensional pattern that is not inclination-converted simultaneously with said inclination-converted ideal pattern on said display section.

5. The charged particle system according to claim 1, further comprising pattern matching means that carries out pattern matching between said ideal pattern and said observation image.

6. The charged particle system according to claim 5, wherein said image processing means has a function of said pattern matching means.

7. The charged particle system according to claim 1, further comprising pattern shifting means that enables manual alignment between said ideal pattern and said observation image.

8. The charged particle system according to claim 1, further comprising:
  inputting means that is used for inputting at least one of the order of display and the thickness of at least one of a plurality of layers forming the ideal pattern as the three-dimensional pattern; and
  storing means that stores the input information.

9. The charged particle system according to claim 8, wherein said image processing means displays on said display section at least one of the order of display and the thickness of at least one of the plurality of layers forming said ideal pattern.

10. The charged particle system according to claim 1, wherein said image processing means carries out a reverse conversion of the ideal pattern as the three-dimensional pattern into the ideal pattern as the two-dimensional pattern based on the inclination angle of said sample and an instruction from an operator to display the ideal pattern of the two-dimensional pattern on the display section as said observation image.

11. The charged particle system according to claim 1, further comprising means of changing the focus and the scanning position of said charged particle beam controlling means based on positional information including the length, the width and the height of said ideal pattern.

* * * * *